United States Patent
Akutsu et al.

(10) Patent No.: US 6,319,652 B1
(45) Date of Patent: Nov. 20, 2001

(54) ENERGY BEAM CURABLE EPOXY RESIN COMPOSITION

(75) Inventors: Mitsuo Akutsu; Tetsuyuki Nakayashiki; Hiroyuki Tachikawa; Kazuo Ohkawa; Satoyuki Chikaoka, all of Tokyo (JP)

(73) Assignee: Asahi Kogaku Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/396,800

(22) Filed: Sep. 15, 1999

Related U.S. Application Data

(62) Division of application No. 08/978,581, filed on Nov. 26, 1997, now Pat. No. 5,985,510.

(30) Foreign Application Priority Data

Nov. 26, 1996 (JP) .................................................. 8-315047

(51) Int. Cl.[7] .......................... G03F 7/038; C08G 59/68; C08G 59/24; C08G 59/30
(52) U.S. Cl. ........................ 430/280.1; 430/170
(58) Field of Search ........................ 430/280.1; 522/170

(56) References Cited

U.S. PATENT DOCUMENTS

| 4,189,548 | 2/1980 | Sakashita et al. .................... 526/237 |
| 4,260,465 | 4/1981 | Via ................................. 204/159.23 |
| 5,434,196 | 7/1995 | Ohkawa et al. ...................... 522/100 |

FOREIGN PATENT DOCUMENTS

| 0 090 239 | 10/1983 | (EP) . |
| 0 360 869 | 4/1990 | (EP) . |
| 0 605 361 A2 | 7/1994 | (EP) . |
| 0 715 212 A1 | 6/1996 | (EP) . |
| 0 831 127 A1 | 3/1998 | (EP) . |
| 0 831 373 A2 | 3/1998 | (EP) . |
| 02-225580 | 9/1990 | (JP) . |
| 96/35756 | 11/1996 | (WO) . |
| 97/11122 | 3/1997 | (WO) . |
| 97/38354 | 10/1997 | (WO) . |

OTHER PUBLICATIONS

RN 14513–43–0, Registry Copyright 1998 ACS.*
Miyaguchi, PTO 2001–2374, English translation of zjp 02–225580, by Diplomatic Language Services, Inc.for USPTO, Washington, DC May 2001.*
90–316748, English Abstract of JP 02225580 printed Sep. 7, 1990, to Ricoh KK, Derwent Information Ltd., 1 page.
JP 402225580A, English Abstract of JP 02–225580 printed Sep. 7, 1990, to Miyaguchi, Copyright 1990, JPO and Japio, from West, File JPAB.
114:83495, English Abstract of JP 02–225580 printed in Sep. 7, 1990 to Miyaguchi, on Chemical Abstracts, American Chemical Society, 1998.

* cited by examiner

Primary Examiner—Cynthia Hamilton
(74) Attorney, Agent, or Firm—Sughrue, Mion, Zinn, Macpeak & Seas, PLLC

(57) ABSTRACT

The energy beam curable epoxy resin composition comprising as essential components, (1) specific cationically polymerizing organic substance,(2) energybeam sensitive cation polymerization initiator, (3) cationically polymerizing organic substance except for the specific cationically polymerizing organic substance, described above, (4) radically polymerizing organic compound, and (5) energy beam sensitive radical polymerization initiator. The cured articles resulted from said resin composition, have superior properties and particularlly superior dimensional stability on humidity absorption. Therefore, a stereolithographic resin composition and a stereolithographic method are also provided.

5 Claims, No Drawings

ENERGY BEAM CURABLE EPOXY RESIN COMPOSITION

This a divisional of application Ser. No. 08/978/581 filed Nov. 26, 1997, now U.S. Pat. No. 5,985,510 the disclosure of which is incorporated herein by reference.

BACKGROUND OF THE INVENTION

1. [Field of the Invention]

The present invention relates to an energy beam curable epoxy resin composition which is curable upon exposure to an energy beam such as an ultraviolet ray or an electron beam, a stereolithographic resin composition using said resin composition and a stereolithographic method. More specifically, the present invention relates to an energy beam curable epoxy resin composition to give the cured resin, which has chemical resistance, water-resistance, humidity-resistance, good adhesive property and reduced shrinkage on curing, a stereolithographic resin composition using said resin composition and a stereolithographic method.

2. [Related Art]

Recently, resin compositions, which are curable upon exposure to an active energy beam such as an ultraviolet ray or an electron beam, are used in various applications such as paint and varnish, coatings, adhesives, sealing compounds and the like. A photo-curable epoxy resin composition is known as one of said energy beam curable resin compositions as described in, for example, Japanese Patent Application No. SHO 63-113022, No. HEI 3-77210, Japanese Patent Application Laid-open No. HEI 1-149848, No. HEI 2-114022, No. HEI 4-266,985.

The photo-curable epoxy resin composition is not influenced with oxygene on curing, being unlike a radically polymerizing photo-curable resin, has superior physical properties such as an adhesive property in the cured articles, and then is expected to be used in wide applications.

This photo-curable epoxy resin composition is composed essentially of an epoxy resin and a photopolymerization initiator. Onium salts are known to be used as a photopolymerization initiator.

Alicyclic epoxy ester compounds, which typically include 3,4-epoxy cyclo-methyl-3,4-epoxy cyclohexane carboxylate "Cylacure UVR-6110, Union Carbide Corp., or Ceroxide-2021, Daicel Chemical Industries LTD." and bis(3,4-epoxy cyclohexylmethyl) adipate "Cylacure UVR-6128, Union Carbide Corp.", are used as a main component for a photopolymerization initiator-curable epoxy resin, since they have preferable reaction rate and physical properties.

A stereolithographic method is a technique, as described in Japanese Patent Application Laid-open No. SHO 60-247515, wherein a given portion of photo-curing resin placed in a vessel is exposed continuously to a beam such as argon, helium-cadmium or semiconductor laser from above to cure the exposed portion, in order to produce a desired plane of cured layer. Then the cured layer is overlaid with another layer of the photo-curing resin, which is then photo-cured in the same manner to produce a second cured layer which continuously overlaps the first layer; and the same process is repeated to finally obtain a desired three-dimensional solid shape.

As resins previously used for the above-described stereolithographic method, mention may be made of radically polymerizing resin compositions and, for example, Japanese Patent Application Laid-open No.HEI 2-228312 and No.HEI 5-279436 disclose a stereolithographic resin composition composed mainly of (meth)acrylic resin. Further, Japanese Patent Application Laid-open No.HEI2-145616, with the aim of reducing deformation, discloses a stereolithographic resin which contains liquid resin and fine particles whose difference in apparent specific gravity is less than 0.2. For producing moldings at higher precision, Japanese Patent Applications Laid-open No.HEI 3-15520 discloses a composition comprising an unsaturated ethylene-derivative monomer, a photo-initiator, and a potentially insoluble, potentially radioactive polarizing substance, and Japanese Patent Applications Laid-open No.HEI 3-41126 discloses a composition comprising an unsaturated ethylene-derivative monomer, a photo-initiator, and a potentially soluble radio-polarizing substance, respectively. In addition, Japanese Patent Application Laid-open No.HEI 4-85314 discloses a resin composition comprising a silicone urethane acrylate, a compound having multifunctional ethylene-type unsaturated bonds, and a polymerization initiator.

Another stereolithographic resins are known cationically polymerizing resin composition. For example, Japanese Patent Application Laid-open No.HEI 1-213304 discloses a cationically polymerizing resin composition characterized by comprising a cationically polymerizing energy beam curable organic compound and a energy beam sensitive cationic polymerization initiator. Japanese Patent Application Laid-open No.HEI 2-28261 discloses a resin comprising a cationically polymerizing energy beam curable organic compound and a portion of a radically polymerizing radio-curing organic compound, which exhibits reduced shrinkage and improved resolution. Also, Japanese Patent Application Laid-open No.HEI 2-80423 discloses a resin composition comprising an epoxy resin, a vinyl ether resin, an energy beam sensitive cationic polymerization initiator, a radically curing resin, and an energy beam sensitive radical polymerization initiator. In addition, Japanese Patent Application Laid-open No.HEI 2-75618 discloses a stereolithographic resin composition characterized by comprising a cationically polymerizing energy beam curable organic compound, an energy beam sensitive cationic polymerization initiator, a radically polymerizing energy beam curable organic compound, an energy beam sensitive radical polymerization initiator, and a polyester having hydroxyl groups.

Among the conventional stereolithographic resin compositions as described above, photo-curable epoxy resin compositions composed mainly of an alicyclic epoxy ester compound generally have improved brightness, heat resistance, chemical resistance and reduced shrinkage on curing in cured articles and thus are used for paint and varnish, coatings, adhesives, sealing compounds and the like. However, the cured articles are required to improve some properties such as alkali-resistance, water-resistance and adhesive property and also express the change in dimensions due to moisture absorption.

Further, any of a radically polymerizing resin and a stereolithographic resin composition composed mainly of it is prevented from curing under oxygen, which results in low degree of cure on curing, so that it is necessary to carried out "post cure process" by ray or heat, which is necessarily concerned in curing of mold. In the post cure process, however, the moldings has such a disadvantage as being apt to deform. Further, these resins show large shrinkage on curing, which makes it difficult to obtain a molding with desirable dimension.

Furthermore, cationically curable stereolithographic resins as described in Japanese Patent Application Laid-open No.HEI 1-213304, No.HEI 2-28261 and No.HEI 2-75618, have such superior charasteristic properties that the post cure process are not necessary and the deformation are little, as the curing proceeds through an active group even after the beam to be exposed are shut down, and it is also easy to obtain a molding with desirable dimension because of small shrinkage on curing. However, these resins have such disadvantages that they have insufficient sensitivity to an energy beam to be exposed, and the cured articles show the deformation by humidity-absorption because of its humidity-absorption.

On the other hand, Japanese Patent Application Laid-open No.SHO 58-172387 discloses a method of producing 2,2-dicyclohexenylpropane di-epoxide, and Japanese Patent Application Laid-open No.SHO 48-29899 discloses an epoxy resin composition consisting of methylene bis(3,4-epoxy cyclohexane) and polycarbonic acid anhydride, which can be cured by heating. However, it has never been known hitherto, whether these alicyclic epoxy compounds are suitable for photo-curing or lithographic molding, or not.

Therefore, the object of the present invention is to provide an energy beam curable epoxy resin composition, a stereolithographic resin composition and a stereolithographic method, which can give the improved cured article, having superior physical properties and a high dimensional stability under humidity absorption.

SUMMARY OF THE INVENTION

In order to attain the object described above, an energy beam curing epoxy resin composition of the present invention comprises as essential components thereof:

(1) a cationically polymerizing organic substance, having the general formula as follows,

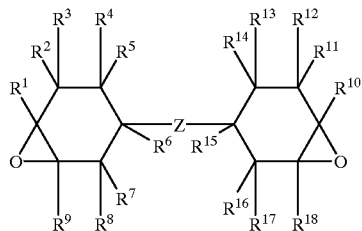

(I)

where 'Z' is a radical, having a valence of 2, selected from the group consisting of oxygen, sulfur, —NH—, —SO—, —SO$_2$—, —CH$_2$—, —C(CH$_3$)$_2$—, —CBr$_2$—, —C(CBr$_3$)$_2$— and —C(CF$_3$)$_2$—, and R$^1$~R$^{18}$, which may be identical or non-identical to each other, are hydrogen, halogen, hydrocarbon group, which may contain oxygen or halogen, or alkoxy group, which may be substituted; and (2) an energy beam sensitive cationic polymerization initiator.

The energy beam curable epoxy resin composition of the present invention may further comprise, (3) a cationically polymerizing organic substance except for that of the aforementioned general formula (I).

The energy beam curable epoxy resin composition of the present invention may furthermore comprise, (4) a radically polymerizing organic compounds; and (5) an energy beam sensitive radical polymerization initiator.

In the energy beam curable epoxy resin composition, it is preferable that 50 wt% or more of (4) radically polymerizing organic compound is a compound having (meth) acrylic group per one molecule.

Further, a stereolithographic resin composition of the present invention comprises using the energy beam curable resin composition described above.

Furthermore, a stereolithographic method of the present invention, wherein a given portion of an energy beam curing resin composition is exposed to an energy beam to cure the exposed portion thereof, in order to produce a desired thickness of cured layer; then, the cured layer is overlaid with another layer of the energy beam curable resin composition, which is then cured in the same manner to produce a second cured layer which continuously overlaps the first layer; and the same process is repeated to finally obtain a three-dimensional molding; comprises using the stereolithographic resin compositions of the present invention described above as an energy beam curable resin composition.

DESCRIPTION OF THE PREFERRED EMBODIMENTS

According to the present invention, in (1) cationically polymerizing organic substance having the general formula (I) described above, 'Z' in the formula (I) is a radical, having a valence of 2, selected from the group consisting of oxygen, sulfur, —NH—, —SO—, —SO$_2$—, —CH$_2$—, —C(CH$_3$)$_2$—, —CBr$_2$—, —C(CBr$_3$)$_2$— and —C(CF$_3$)$_2$—, preferably —SO$_2$—, —CH$_2$—, —C(CH$_3$)$_2$—, or —C(CF$_3$)$_2$— particularly preferably —CH$_2$— or —C(CH$_3$)$_2$—. R$^1$~R$^{18}$ in the formula (I) may be identical or non-identical to each other, and are hydrogen, halogen, hydrocarbon group, which may contain oxygen or halogen, or alkoxy group, which may be substituted, and preferably may be identical or non-identical to each other, and are hydrogen, chlorine, methyl group, ethyl group or methoxy group, particularly preferably hydrogen.

In the present invention, two or more cationically polymerizing organic substances having the general formula (I) described above can be used in combination.

(2) Energy beam sensitive cationic polymerization initiator, which is used according to the present invention, is a compound which can emit a substance that initiates cationic polymerization upon exposure to an energy beam, preferably a double salt of an onium which emits a Lewis acid upon exposure, or a derivative thereof. A typical example of such compounds is a salt of a cation and an anion, expressed generically by a following formula:

Preferably, the cation A$^{m+}$ is an onium having a structure such as one expressed as the following general formula:

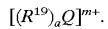

Here, R$^{19}$ is an organic group having 1 to 60 carbons and any number of non-carbon atoms. The number 'a' is an integral number in the range of 1 to 5. The 'a' groups, R$^{19}$, are independent of and may be identical or non-identical to each other; preferably, at least one of them is to be an organic group having an aromatic ring as described above. The symbol 'Q' denotes an atom or an atomic group selected from the group consisting of S, N, Se, Te, P, As, Sb, Bi, O, I, Br, Cl, F and N≡N. Assuming the valence of 'Q' in the cation Am$^+$ as 'q', it is required that the relation m=a−q is observed, (here, the valency of 'N≡N' is assumed as 0).

The anion B$^{m−}$ is preferably a halide complex having a structure such as one expressed as the following general formula:

$[LX_b]^{m-}$.

Here, 'L' is a central metal or metalloid atom of the halide complex, such as B, P, As, Sb, Fe, Sn, Bi, Al, Ca, In, Ti, Zn, Sc, V, Cr, Mn or Co. The symbol 'X' denotes a halogen. The number 'b' is an integral number in the range of 3 to 7. Assuming the valence of 'L' in the anion $B^{m-}$ as 'p', it is required that the relation m=b–p is observed.

Examples of anions expressed by the above generic formula $[LX_b]^{m-}$ include tetrafluoroborate $(BF_4)^-$, hexafluorophosphate $(PF_6)^-$, hexafluoroantimonate $(SbF_6)^-$, hexafluoroarsenate $(As F_6)^-$, and hexachloroantimonate $(SbCl_6)^-$.

A structure expressed as $[LX_{b-1}(OH)]^{m-}$ may also preferably be used as the anion $B^{m-}$, where 'L', 'X' and 'b' are defined as described above. Other suitable anions include perchloric ion $(ClO_4)^-$, trifluoromethylsulfurous ion $(CF_3SO_3)^-$, fluorosulfonic ion $(FSO_3)^-$, toluenesulfonic anion, and trinitrobenzenesulfonic anion.

In the present invention among these onium salts mentioned above, it is particularly effective to use aromatic onium salts of (a) to (c) as follows. One or more kinds of these onium salts can be used as a mixture thereof.
(a) Aryl diazonium salts such as phenyl diazonium-hexafluorophosphate, 4-methoxyphenyl diazonium-hexafluoroantimonate and 4-methylphenyl diazonium-hexafluorophosphate,
(b) diaryl iodonium salts such as diphenyl iodonium-hexafluoroantimonate, di(4-methylphenyl)iodonium-hexafluorophosphate and di(4-tert-butylphenyl) iodonium-hexafluorophosphate,
(c) triaryl sulfonium salts such as triphenyl sulfonium-hexafluoroantimonate, tris(4-methoxyphenyl)sulfonium-hexafluorophosphate, diphenyl-4-thiophenoxyphenyl sulfonium-hexafluoroantimonate, diphenyl-4-thiophenoxyphenyl sulfonium-hexafluorophosphate, 4,4'-bis(diphenylsulfonio)phenylsulfide-bis-hexafluoroantimonate, 4,4'-bis(diphenylsulfonio)phenylsulfide-bis-hexafluorophosphate, 4,4'-bis[di(β-hydroxyethoxy)phenylsulfonio]phenylsulfid-bis-hexafluorantimonate, 4,4'-bis[bis (β-hydroxyethoxy) phenylsulfonio]phenylsulfid-bis-hexafluorophosphate, 4[4'-(benzoyl)phenylthio]phenyl-di-(4-fluorophenyl)sulfoniumhexafluoroantimonate and 4 (4'-(benzoyl) phenylthio)phenyl-di-(4-fluorophenyl)sulfoniumhexafluorophosphate.

Further, mention may be made of iron-arene complex such as ($\eta^5$-2,4-cyclopentadiene-1-yl) [(1,2,3,4,5,6,-72)-(1-methylethyl)benzene]-iron-hexafluorophosphate, and the mixture of alminium complex such as tris(acetylacetonato) alminium, tris(ethylacetonatoacetate)alminium, tris (salicylaldehydate)alminium, with silanol such as triphenyl silanol.

Among these compounds, aromatic iodonium salts, aromatic sulfonium salts and iron-allene complex are preferably used from viewpoint of practical use and photo-sensitivity.

(3)Cationically polymerizing organic substance except for that having the aforementioned general formula (I), which is used in the present invention is a compound which polymerizes or cross-links in the presence of an energy beam sensitive cationic polymerization initiator which is activated by exposure to an energy beam, except for the cationically polymerizing organic substance having the above mentioned general formula (I).

Examples of such compounds include epoxy compounds, cyclic ether compounds, cyclic lactone compounds, cyclic acetal compounds, cyclic thioether compounds, spiroorthoester compounds, and vinyl compounds, which have the structure except for the cationically polymerizing organic substance having the general formula (I) described above. They may be used independently or in combination. Among them, epoxy compounds are suited, for their availability and ease of handling. As such epoxy compounds, aromatic, alicyclic, aliphatic epoxy resins, and the like are mentioned.

Examples of the aromatic epoxy resins described above, include polyglycidyl ethers of polyhydric phenols having at least one aromatic ring, or their adducts with alkylene oxide, such as bisphenol A, bisphenol F, the glycidyl ethers of their adducts with alkylene oxides, or epoxy-novolac resins.

Further, examples of the alicyclic epoxy resins described above, include polyglycidyl ethers of poly-hydric alcohols having at least one alicyclic ring, or a compound containing cyclohexane-oxide or cyclopentene-oxide obtained by epoxidation of a compound having a structure of cyclohexene- or cyclopentene-ring with oxidant. For example, mention may be made of diglycidyl ether of hydrogenated bisphenol A, 3,4-epoxycylohexylmethyl-3,4-epoxycyclohexane carboxylate, 3,4-epoxy-1-methylcylohexyl-3,4-epoxy-1-methylcyclohexane carboxylate, 6-methyl-3,4-epoxycylohexylmethyl-6-methyl-3,4-epoxycyclohexane carboxylate, 3,4-epoxy-3-methylcylohexylmethyl-3,4-epoxy-3-methylcyclohexane carboxylate, 3,4-epoxy-5-methylcylohexylmethyl-3,4-epoxy-5-methylcyclohexane carboxylate, 2-(3,4-epoxycyclohexyl-5,5-spiro-3,4-epoxy)cyclohexane-methadioxane, bis(3,4-epoxycyclohexylmethyl) adipate, vinyl cyclohexene dioxide, 4-vynyl epoxycyclohexane, bis (3,4-epoxy-6-methylcyclohexylmethyl) adipate, 3,4-epoxy-6-methylcyclohexyl carboxylate, methylene bis(3,4-epoxycyclohexane), dicyclopentadiene diepoxide, ethyleneglycol di(3,4-epoxycyclohexylmethyl)ether, ethylene bis(3,4-epoxycyclohexane carboxylate), dioctyl epoxyhexahydrophthalate, di-2-ethylhexyl epoxyhexahydrophthalate, and the like.

And also, examples of the aliphatic epoxy resins described above, include polyglycidyl ethers of aliphatic polyhydric alcohols or their alkylene oxide adducts, polyglycidyl esters of aliphatic, long chain, poly-basic acids, homopolymers of glycidyl acrylate or methacrylate prepared by vinyl polymerization, copolymers of glycidyl acrylate or methacrylate, prepared by vinyl polymerization with other vinyl monomer and the like. Typical examples of such compounds include glycidyl ethers of polyhydric alcohols, such as 1,4-butanediol diglycidyl ether, 1,6-hexanediol diglycidyl ether, triglycidyl ether of glycerol,triglycidyl ether of trimethylol propane, tetraglycidyl ether of sorbitol, hexaglycidyl ether of dipentaerythritol, diglycidyl ether of polyethylene glycol, and diglycidyl ether of polypropylene glycol; polyglycidyl ethers of polyether-polyols, which can be obtained by adding one or more alkylene oxides with aliphatic polyhydric alcohols such as propylene glycol, trimethylol propane and glycerol; and diglycidyl esters of aliphatic, long chain di-basic acids. Further, mention may be made of mono-glycidyl ethers of aliphatic higher alcohols; mono-glycidyl ethers of phenol, cresol, butyl phenol, or polyether alcohols which can be obtained by adding alkylene oxide thereto; glycidyl esters of higher fatty acids; epoxidized soybean oil; octyl epoxy-stearate; butyl epoxy-stearate; epoxidized linseed oil; epoxidized polybutadiene and the like.

Examples of cationically polymerizing organic compounds except for epoxy compounds, which can be employ in this invention, include trimethylene oxide, oxetane compounds such as 3,3-dimethyl oxetane and 3,3-dichloromethyl oxetane; trioxane such as tetrahydrofuran and 2,3-dimethyl-tetrahydrofuran; cyclic ether compounds such as 1,3-dioxorane and 1,3,6-trioxa-cyclooctane; cyclic lactones such as β-propiolactone, γ-bulyrolactone and ε-caprolactone; thiirane compounds such as ethylene sulfide; thietane compounds such as trimethylene sulfide and 3,3-dimethyl thietane; cyclic thio-ether compounds such as tetrahydro-thiophene derivatives; spiro-ortho ester compounds obtained by the reaction of epoxy compounds with lactones; vinyl ether compounds such as ethylene glycol divinylether, alkyl vinytether, 3,4-dihydropyrane-2-methyl (3,4-dihydropyrane-2-carboxylate) and triethyleneglycol divinyl ether; ethylenic unsaturated compounds such as styrene, vinyl cyclohexene, iso-butylene and polybutadiene, and the derivatives thereof, spiro-ortho carbonate compounds, cyclo carbonate compounds.

According to the present invention, the content of the (3) cationically polymerizing organicsubstance except for that having the general formula (I) mentioned above is preferably not more than 500 parts by weight per 100 parts of the cationically polymerizing organic substance having the general formula (I) mentioned above.

The content of the (2) energy beam sensitive cationic polymerization initiator is 0.05 to 30 wt %, preferably 0.5 to 10 wt %, based on the (1) cationically polymerizing organic substance having the general formula (I) mentioned above, or the sum of the (1) cationically polymerizing organic substance having the aforementioned general formula (I) and the (3) cationically polymerizing organic substance except for that having the aforementioned general formula (I). If this content is less than 0.05 wt %, the sensitivity becomes inferior, on the other hand, if this content is more than 30 wt %, curing property and adhesion property become inferior, and the resulting cured article is apt to get coloring.

(4) Radically polymerizing organic compound, which is used according to the present invention, is a radically polymerizing organic compound which polymerizes or cross-links upon exposure to an energy beam in the presence of a energy beam sensitive radical polymerization initiator and, preferably, has at least one unsaturated double bond per one molecule.

Examples of such compounds include acrylate compounds, methacrylate compounds, allyl urethane compounds, unsaturated polyester compounds, and styrene series compounds.

Among these radically polymerizing organic compounds, those having (meth)acrylic groups, such as epoxy (meth) acrylates, urethane (meth)acrylates, polyester (meth) acrylates, polyether (meth)acrylates, (meth)acrylic esters of alcohols, are best suited, for their availability and ease of synthesis and handling.

Here, epoxy (meth)acrylates refer to acrylates which are obtained by the reaction of, for example, a known aromatic, alicyclic or aliphatic epoxy resin and (meth)acrylic acid. The most preferable of these epoxy acrylates are the acrylates of aromatic epoxy resins which are obtained by the reaction of a polyglycidyl ether of a polyhydric phenol having at least one aromatic nuclei or an added alkylene oxide thereof, and (meth)acrylic acid. One example is the (meth)acrylate obtained by the reaction of a glycidyl ether and (meth) acrylic acid, the former obtained by the reaction of bisphenol A or an added alkylene oxide thereof and epichlorohydrin. Another example is the (meth)acrylate obtained by the reaction of an epoxy novolac resin and (meth)acrylic acid.

The most preferable urethane (meth)acrylates are those obtained by the reaction of one or more polyesters or polyethers having a hydroxyl group, a (meth)acrylic ester having a hydroxyl group, and an isocyanate, and those obtained by the reaction of a (meth)acrylic ester having a hydroxyl group and an isocyanate.

Among polyesters having a hydroxyl group, the most preferable ones are those obtained by the reaction of one or more polyhydric alcohols and one or more polybasic acids or one or more lactones. Examples of the polyhydric alcohols include 1,3-butanediol, 1,4-butanediol, 1,6-hexanediol, diethylene glycol, triethylene glycol, neopentyl glycol, polyethylene glycol, polypropylene glycol, polybutylene glycol, trimethylolpropane, glycerol, pentaerythritol, and dipentaerythritol.

Examples of the polybasic acids include adipic acid, terephthalic acid, phthalic anhydride, and trimellitic acid. Examples of the lactones include β-propiolactone, γ-butylolactone and ε-caprolactone.

Among polyethers having a hydroxyl group, the most preferable ones are those obtained by adding one or more alkylene oxides to a polyhydric alcohol. Examples of the polyhydric alcohols are such as those listed above. Examples of the alkylene oxides include ethylene oxide propylene oxide and butylene oxide.

Among (meth)acrylic esters having a hydroxyl group, the most preferable ones are those obtained by the esterification of a polyhydric alcohol and (meth)acrylic acid. Examples of the polyhydric alcohols are such as those listed above.

The best suited of these (meth)acrylic esters having a hydroxyl group are those obtained by the esterification of a dihydric alcohol and (meth)acrylic acid, such as 2-hydroxyethyl (meth)acrylate.

Among isocyanates, the most preferable ones are those having at least one or more isocyanic group per one molecule, particularly divalent isocyanic compounds such as tolylene diisocyanate, hexamethylene diisocyanate, and isophorone diisocyanate.

The most preferable polyester (meth)acrylates are those obtained by the reaction of a polyester having a hydroxyl group and (meth)acrylic acid. Among polyesters having a hydroxyl group, the most preferable ones are those obtained by the esterification of one or more polyhydric alcohols and one or more monoacids, polybasic acids. Examples of the polyhydric alcohols are such as those listed above. Examples of the monoacids include formic acid, acetic acid, butyric acid, and benzoic acid. Examples of the polybasic acids include adipic acid, terephthalic acid, phthalic anhydride, and trimellitic acid.

The most preferable polyether (meth)acrylates are those obtained by the reaction of a polyether having a hydroxyl group and (meth)acrylic acid. Among polyethers having a hydroxyl group, the most preferable ones are those obtained by adding one or more alkylene oxides to a polyhydric alcohol. Examples of the polyhydric alcohols are such as those listed above. Examples of the alkylene oxides include ethylene oxide, propylene oxide and butylene oxide.

The most preferable (meth)acrylic esters of alcohols are (meth)acrylates obtained by the reaction of an aromatic or aliphatic alcohol having at least one hydroxyl group per one molecule or an added alkylene oxide thereof, and (meth) acrylic acid. Examples of such (meth)acrylates include 2-ethylhexyl (meth)acrylate, 2-hydroxyethyl (meth)acrylate, 2-hydroxypropyl (meth)acrylate, isoamyl (meth)acrylate, lauryl (meth)acrylate, stearyl (meth)acrylate, isooctyl (meth) acrylate, tetrahydrofurfuryl (meth)acrylate, isobonyl (meth) acrylate, benzyl (meth)acrylate, 1,3-butanediol di(meth) acrylate, 1,4-butanediol di(meth)acrylate, 1,6-hexanediol di(meth)acrylate, diethylene glycol di(meth)acrylate, triethylene glycol di(meth)acrylate, neopentyl glycol di(meth) acrylate, polyethylene glycol di(meth)acrylates, polypropylene glycol di(meth)acrylates, trimethylolpropane tri(meth) acrylate, ethylene oxide-modified trimethylolpropane tri (meth)acrylate, propylene oxide-modified trimethylolpropane tri(meth)acrylate, pentaerythritol tetra (meth)acrylate, dipentaerythritol hexa(meth)acrylate, and ε-caprolactone-modified dipentaerythritol hexa(meth) acrylate.

In this invention, it is also preferable that 50 parts by weight or more of the (4) radically polymerizing organic compound, per 100 parts by weight, is a compound having (meth)acrylic group in the molecule.

The content of the (4) radically polymerizing organic compound used in this invention is preferably not more than 200 parts by weight, particularly preferably not more than 100 parts by weight, per 100 parts by weight of the cationically polymerizing organic substances.

The (5) energy beam sensitive radical polymerization initiator, used in this invention, is a compound, which enables to initiate the radical polymerization upon exposure to an energy beam, and preferably includes ketone series compounds such as acetophenone series compounds, benzyl series compounds and thioxanthone series compounds.

Acetophenone series compounds include, for example, diethoxyacetophenone, 2-hydroxy-2-methyl-1-phenylpropane-1-one, 4'-iso-propyl-2-hydroxy-2-methylpropiophenone, 2-hydroxymethyl-2-methylpropiophenone, 2,2-dimethoxy-1,2-diphenylethane-1-one, p-dimethylaminoacetophenone, p-tert-butyldichloroacetophenone, p-tert-butyltrichloroacetophenone, p-azidobenzalacetophenon, 1-hydroxycyclohexylphenylketone, 2-methyl-1-[4-(methylthio)phenyl]-2-morpholinopropanone-1, 2-benzyl-2-dimethylamino-1-(4-morpholinophenyl)-butanone-1, benzoin, benzoin methyl ether, benzoin ethyl ether, benzoin isopropyl ether, benzoin-n-butyl ether, benzoin isobutyl ether and the like.

Benzyl series compounds include benzyl, anisyl and the like.

Benzophenone series compounds include, for example, benzophenone, methyl o-benzoyl benzoate, Michler's ketone, 4,4'-bisdiethylamino benzophenone, 4,4'-dichlorobenzophenone, 4-benzoyl-4'-methyldiphenyl sulfide and the like. Thioxanthone series compounds include thioxanthone, 2-methylthioxanthone, 2-ethylthioxanthone, 2-chlorothioxanthone, 2-isopropylthioxanthone, 2,4-diethylthioxanthone and the like.

Other energy beam sensitive radical polymerization initiators include 2,4,6-trimethylbenzoyldiphenyl phosphine oxide, bis(cyclopentadienyl)-bis[2,6-difluoro-3-(pyl-1-yl)] titanium and the like.

The above (5) energy beam sensitive radical polymerization initiators may be used independently or in combination to attain a desired property.

If desired, a photosensitizer, which is not essential, may be added in the energy beam curable epoxy resin composition of this invention in the range of this invention. The combination of the photo-sensitizer such as anthracene derivative or pyrene derivative further improves the cure rate compared with the resin composition without the photo-sensitizer, and as a result, more preferable energy beam curable epoxy resin can be obtained. Generally, the content of the photo-sensitizer is 20 to 300 wt % based on the (2) energy beam sensitive cation polymerization initiator.

Organic compounds having two or more hydroxyl groups per one molecule, which are not essential component, may be added in the energy beam curable epoxy resin composition according to the present invention in the range of this invention. When organic compounds having two or more hydroxyl groups per one molecule, such as polyhydric alcohols, polyethers containing hydroxy groups, polyesters containing hydroxy groups and polyhydric phenols are added in the resin composition, flexible cured articles can be obtained.

Examples of the polyhydric alcohols include ethylene glycol, propylene glycol, neopentyl glycol, trimethylolpropane, glycerol, pentaerythritol, dipentaerythritol, 1,3-butanediol, 1,4-butanediol, 1,6-hexanediol and the like.

The polyether containing hydroxy groups means a compound obtained by adding one or more alkylene oxide to one or more polyhydric alcohols or one or more polyhydric phenols. Examples of the polyhydric alcohols used therein include ethylene glycol, propylene glycol, neopentyl glycol, trimethylolpropane, glycerol, pentaerythritol, dipentaerythritol, 1,3-butanediol, 1,4-butanediol, 1,6-hexanediol, polyhydric phenols used therein include bisphenol A, bisphenol F, phenol novolak, cresol novolak and the like. On the other hands, examples of the alkylene oxides include butylen oxide, propylene oxide, ethylene oxide and the like.

Further, the polyester containing hydroxy groups means a polyester obtained by esterificatioin of one or more monobasic or polybasic acids and one or more polyhydric alcohols or polyhydric phenols, and a polyester obtained by esterification of one or more lactones and one or more polyhydric alcohols. Examples of the polyhydric alcohols or polyhydric phenols such as those listed above. Examples of the monobasic acids include formic acid, acetic acid, butyric acid, benzoic acid and the like. Examples of the polybasic acids include adipic acid, terephthalic acid, trimellitic acid and the like. Examples of the lactones include β-propiolactone, γ-butyrolactone and ε-caprolactone.

The polyhydric phenol means a compound containing two or more hydroxy groups, bonded directly to aromatic ring, per one molecule, such as those listed above.

The content of the organic compound having two or more hydroxy groups per one molecule is 1 to 5 wt % based on the (1) cationically polymerizing organic substance having the general formula (I) mentioned above, or the sum of the (1) cationically polymerizing organic substance having the general formula (I) mentioned above and the (3) cationically polymerizing organic substance except for that having the general formula (I) mentioned above.

Thermoplastic polymers, which are not essential, may be added in the energy beam curable epoxy resin composition according to the present invention in the range of this invention. The thermoplastic polymer compound is a polymer compound which is in a liquid or solid state at room temperature and can be uniformly mixed with the resin composition at room temperature.

Typical examples of such thermoplastic polymer compounds include polyester, polyvinyl acetate, polyvinyl chloride, polybutadiene, polycarbonate, polystyrene, polyvinyl ether, polyvinylbutyral, polyacrylate, polymethyl methacrylate, polybutene, and styrene-butadiene block copolymer hydrogenated. Derivatives of these thermoplastic polymer compounds having functional groups such as a hydroxyl, carboxyl, vinyl or epoxy group may also be used. The preferable number-average molecular weight of said thermoplastic polymer compound as used in the present invention is 1000 to 500000, most preferably 5000 to 100000.

The energy beam curable epoxy resin composition according to the present invention with the thermoplastic polymer compound further improves the mechanical properties of the cured resin, compared with the same composition without it, and as a result, the resulting composition is more preferable. The content of the thermoplastic polymer compound is generally 3 to 100 wt % based on the (1) cationically polymerizing organic substance having the general formula (I) mentioned above, or the sum of (1) and (3) cationically polymerizing organic substance except for (1), or the sum of (1),(3) and (4) radically polymerizing organic compound.

Further, fillers, which are not essential, may be added in the energy beam curable epoxy resin composition of this invention in the range of this invention. The fillers mean inorgaic or organic, powdered, flaky or fibrous materials.

Examples of inorganic fillers include glass powder, mica powder, silica powder or powder of ground quartz, carbon powder, powder of calcium carbonate, almina powder, powder of alminium hydroxide, powder of aluminium silicate, powder of zirconium silicate, powder of iron oxide, powder of barium sulfate, kaolin, dolomite, metal powder, glass fiber, carbon fiber, asbestos, metallic whisker, whiskering calcium carbonate, hollow glass baloon and products bound with organic groups on the surface thereof by treating with coupling agent.

Examples of organic fillers include pulp powder, nylon powder, polyethylene powder, powder of crosslinked polystyrene, powder of crosslinked acrylic resin, powder of crosslinked phenol resin, powder of crosslinked urea resin, powder of crosslinked melamine resin, powder of crosslinked epoxy resin, powdered rubber, and products bound with reactive groups such as epoxy group, acrylic group or hydroxyl group on the surface thereof. The content of fillers is generally 0.5 to 30 wt %, preferably 1 to 20 wt %, based on the (1) cationically polymerizing organic substance having the general formula (I) mentioned above, or the sum of (1) and (3) cationically polymerizing organic substance except for (1), or the sum of (1),(3) and (4) radically polymerizing organic compound.

Various resin additives, such as thermosensitive cationic polymerization initiator, coloring agent such as pigment or dye, leveling agent, defoamer, thickener, flame retardant, antioxidant and stabilizer may be added as desired in the amounts of their normal use, provided that they do not impair the advantage of the present invention.

As the thermosensitive cationic polymerization initiater, for example, onium salts such as 2-butynyl tetramethylene sulfonium hexafluoroantimonate and 3-methyl-2-butynyl tetramethylene sulfonium hexafluoroantimonate, described in Japanese Patent Application Laid-open No.SHO 57-49613 and SHO 58-37004, can be mentioned.

The active energy beam required to cure the energy beam curable epoxy resin composition according to the present invention may be an ultraviolet ray, an electron beam, an X-ray, a radioactive ray, or a high-frequency wave, preferably an ultraviolet ray for the economical reason. Examples of a source of the ultraviolet ray include an ultraviolet laser, a mercury lamp, a xenon lamp, a sodium lamp, and an alkali metal lamp.

The energy beam curing epoxy resin composition of the present invention can be applied to metal, rubber, plastic, molding article, film, paper, wood, glass, concrete, ceramic article, etc.

On the other hand, as the embodiment of application, the energy beam curing epoxy resin composition can be used for paint and varnish, coating, ink, resist, adhesive, molding compound, casting material, putty, impregnant, etc.

Then, the detail of the stereolithographic resin composition and the stereolithographic method is set forth as follows.

As the stereolithographic resin composition of the present invention, the energy beam curing epoxy resin composition of the present invention described above can be used as such.

To carry out the stereolithographic method of the present invention, it is necessary to previously prepare an energy beam curing epoxy resin composition to be used as a stereolithographic resin composition.

This preparing process may be performed in a known manner by, for example, thoroughly mixing the components by blade turbine agitation, roll kneading, or other method. The preferred compounding ratio of (1) and (2), (1), (2) and (3), or (1), (2), (3), (4) and (5), which are the essential components of the stereolithographic resin composition, and the types and contents of the additives to be mixed as necessary may be selected according to the aforementioned compounding ratio of the energy beam curing epoxy resin composition. Thus obtained stereolithographic resin composition is generally in a liquid state at room temperature.

In the next step, a given portion of the stereolithographic resin composition is exposed to an energy beam to cure the exposed portion thereof, in order to produce a desired thickness of cured layer; then, the cured layer is overlaid with another layer of the energy beam curing resin composition, which is radio-cured in the same manner to produce a cured layer which continuously overlaps the first above-described cured; and the same process is repeated to finally obtain a three-dimensional solid shape. For example, the resin composition is placed in a vessel such as one described in Japanese Patent Application Laid-open No.60-247515; a light guide is set on the surface of the resin composition; a selected portion of the surface of the resin composition is exposed to an active energy beam, which is necessary for curing, through the light guide, while moving the light guide relative to the vessel, to obtain a desired solid shape.

The type of the active energy beam required for the stereolithographic method according to the present invention is the same as the active energy beam used for curing the energy beam curable resin composition according to the present invention. That is, an ultraviolet ray, an electron beam, an X-ray, a radioactive ray, or a high-frequency wave may be used, preferably an ultraviolet ray for the economical reason. Examples of a source of an ultraviolet ray include an ultraviolet laser, a mercury lamp, a xenon lamp, a sodium lamp, and an alkali metal lamp. The most preferable source is a laser for its superior light convergence property.

The following examples and comparative examples are given for the purpose of illustration for the embodiment of this invention.

EXAMPLES 1 to 20

Comparative Examples 1 to 10

The energy beam curable resin compositions shown in Tables 1 and 2 were obtained by uniformly mixing components. Numerical values shown in Tables are "parts by weight".

In Tables, epoxy resins as a cationically polymerizing organic substance and energy beam sensitive cation polymerization initiators, which were used in each Example and each Comparative Example, are expressed as follows:

Epoxy resin A: 2,2-bis(3,4-epoxy cyclohexyl)propane,

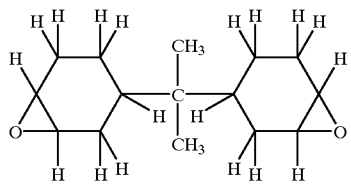

Epoxy resin B: methylenebis (3,4-epoxy cyclohexane),

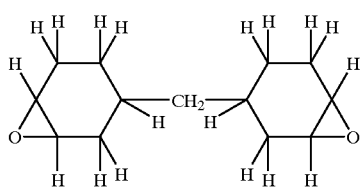

Epoxy resin C: 3.4-epoxy cyclohexylmethyl-3,4-epoxy cyclohexane carboxylate, Epoxy resin D: bis (3,4-epoxy cyclohexylmethyl) adipate, Epoxy resin E: 1,4-butanediol diglycidyl ether, Initiator 1: di-(4-tert-butylphenyl)iodonium hexafluorosppphate,

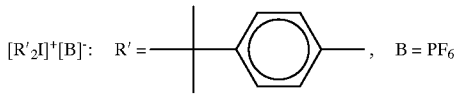

Initiator 2: diphenyl-4-thiophenoxyphenyl sulfonium hexafluoroantimonate.

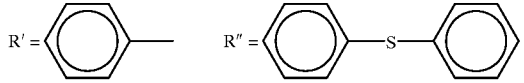

B=SbF$_6$

Initiator 3: 4-[4'-(benzoyl)phenylthio]phenyl-di-(4-fluorophenyl)sulfonium hexafluoroantimonate,

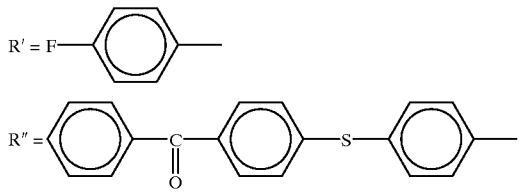

B=SbF$_6$

Initiator 4: 4,4'-bis(diphenylsulfonio)phenylsulfid-bis-hexafluoroantimonate,

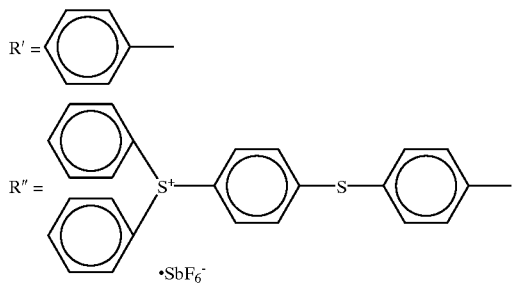

B=SbF$_6$

Initiator 5: 4,4'-bis-[di (β-hydroxyethoxy)phenylsulfonio] phenylsulfid-bis-hexafluoroantimonate,

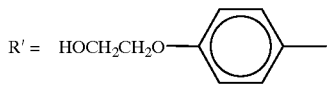

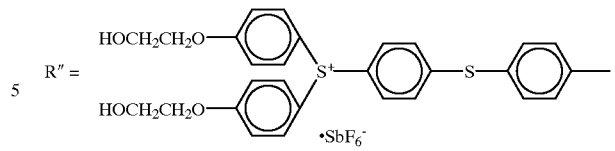

B=SbF$_6$

Here, the evaluations of the properties tested in Tables 1 and 2 were performed by the following methods.

[Degree of Transparency]

Degree of transparency of the compositions was determined by visual evaluation.

◯: completely transparent

Δ: slightly turbid

×: turbid

[Degree of Dry Tack]

The testing resin composition was coated on aluminum test panel with 5 μm of thickness, then the test panel was exposed to ultraviolet ray from the distance of 10 cm by a high-pressure mercury lamp (80 w/cm) to cure the coating surface, and the exposed dose (mJ/cm$^2$) was determined until reaching to dry tack on the coating surface of the test panel.

◯: less than 50 mJ/cm$^2$

Δ: from 50 mJ/cm$^2$ to less than 100 mJ/cm$^2$

×: equal to or more than 100 mJ/cm$^2$

[Brightness]

The cured coating surface was determined by visual evaluation after the coating surface was exposed to ultraviolet ray until reaching to dray tack.

◯: good brightness

Δ: cloudy

×: no brightness

[Alkali Resistant]

The resin composition to be tested was coated on a bonderized steel with 20 μm of thickness, then exposed with 100 mJ/cm$^2$ of dose by a high-pressure mercury-vapor lamp to form a cured coating film. A solution of 1N-NaOH was dropped on the cured coating film. The coating film was held horizontally to prevent removing of liquid and covered with a dish to prevent vaparizing of liquid. After keeping for 24 hrs., the coating film was washed by running water and then the change of the coating film was observed by visual evaluation.

◯: no change

Δ: whitening of film

×: disappearance of film

[Water Absorption]

The resin composition to be tested was injected into the space between two glass plates sandwiching a spacer with 3 mm of thickness, and exposed to ultraviolet ray to produce a specimen (30 mm×30 mm×3 mm). Ultraviolet ray was exposed with 2000 mJ/cm$^2$ dose by a high-pressure mercury-lamp (80 w/Cm ). Water absorption of the specimen was determined according to JIS-K6911.

TABLE 1

|  | Example |  |  |  |  |  |  |  |  |  | Comparative example |  |  |  |  |
|---|---|---|---|---|---|---|---|---|---|---|---|---|---|---|---|
|  | 1 | 2 | 3 | 4 | 5 | 6 | 7 | 8 | 9 | 10 | 1 | 2 | 3 | 4 | 5 |
| Epoxy resin A | 100 | 100 | 100 | 100 | 100 |  |  |  | 50 | 50 |  |  |  |  |  |
| Epoxy resin B |  |  |  |  |  | 100 | 100 | 100 | 50 | 50 |  |  |  |  |  |
| Epoxy resin C |  |  |  |  |  |  |  |  |  |  | 100 | 100 | 100 | 50 | 50 |
| Epoxy resin D |  |  |  |  |  |  |  |  |  |  |  |  |  | 50 | 50 |
| Epoxy resin E |  |  |  |  |  |  |  |  |  |  |  |  |  |  |  |
| Initiator 1 | 3 |  |  |  |  |  |  |  |  |  | 3 |  |  |  |  |
| Initiator 2 |  | 2 |  |  |  |  |  |  |  |  |  |  |  |  |  |
| Initiator 3 |  |  | 2 |  |  | 2 |  |  |  |  |  | 2 |  |  |  |
| Initiator 4 |  |  |  | 2 |  |  | 2 |  | 2 |  |  |  | 2 | 2 |  |
| Initiator 5 |  |  |  |  | 2 |  |  | 2 |  | 2 |  |  |  |  | 2 |
| Transparency[1] | ○ | ○ | ○ | ○ | ○ | ○ | ○ | ○ | ○ | ○ | ○ | ○ | ○ | ○ | ○ |
| Dry tack[2] | ○ | ○ | ○ | ○ | ○ | ○ | ○ | ○ | ○ | ○ | ○ | ○ | ○ | ○ | ○ |
| Brightness[3] | ○ | ○ | ○ | ○ | ○ | ○ | ○ | ○ | ○ | ○ | ○ | ○ | ○ | ○ | ○ |
| Alkali resist[4] | ○ | ○ | ○ | ○ | ○ | ○ | ○ | ○ | ○ | ○ | x | x | x | x | x |
| Water abs. (%)[5] | 0.29 | 0.29 | 0.28 | 0.26 | 0.25 | 0.3 | 0.31 | 0.32 | 0.37 | 0.35 | 1.01 | 0.98 | 0.97 | 0.91 | 0.92 |

Note
[1] degree of transparency
[2] degree of dry tack
[3] brightness
[4] alkali resistance
[5] water absorption (%)

TABLE 2

|  | Example |  |  |  |  |  |  |  |  |  | Comparative Example |  |  |  |  |
|---|---|---|---|---|---|---|---|---|---|---|---|---|---|---|---|
|  | 11 | 12 | 13 | 14 | 15 | 16 | 17 | 18 | 19 | 20 | 6 | 7 | 8 | 9 | 10 |
| Epoxy resin A | 80 | 80 | 80 | 80 | 80 |  |  |  | 80 | 80 |  |  |  |  |  |
| Epoxy resin B |  |  |  |  |  | 80 | 80 | 80 |  |  |  |  |  |  |  |
| Epoxy resin C |  |  |  |  |  |  |  |  | 20 |  | 80 | 80 | 80 | 80 |  |
| Epoxy resin D |  |  |  |  |  |  |  |  |  | 20 |  |  |  |  | 80 |
| Epoxy resin E | 20 | 20 | 20 | 20 | 20 | 20 | 20 | 20 |  |  | 20 | 20 | 20 | 20 | 20 |
| Initiator 1 | 3 |  |  |  |  |  |  |  |  |  | 3 |  |  |  |  |
| Initiator 2 |  | 2 |  |  |  |  |  |  |  |  |  |  |  |  |  |
| Initiator 3 |  |  | 2 |  |  | 2 |  |  |  |  |  | 2 |  |  |  |
| Initiator 4 |  |  |  | 2 |  |  | 2 |  | 2 |  |  |  | 2 |  |  |
| Initiator 5 |  |  |  |  | 2 |  |  | 2 |  | 2 |  |  |  | 2 | 2 |
| Transparency | ○ | ○ | ○ | ○ | ○ | ○ | ○ | ○ | ○ | ○ | ○ | ○ | ○ | ○ | ○ |
| Dry tack | ○ | ○ | ○ | ○ | ○ | ○ | ○ | ○ | ○ | ○ | ○ | ○ | ○ | ○ | ○ |
| Brightness | ○ | ○ | ○ | ○ | ○ | ○ | ○ | ○ | ○ | ○ | ○ | ○ | ○ | ○ | ○ |
| Alkali resist. | ○ | ○ | ○ | ○ | ○ | ○ | ○ | ○ | ○ | ○ | Δ | Δ | Δ | Δ | x |
| Water abs. (%) | 0.36 | 0.3 | 0.31 | 0.32 | 0.32 | 0.38 | 0.37 | 0.37 | 0.35 | 0.35 | 0.85 | 0.82 | 0.82 | 0.82 | 0.92 |

EXAMPLES 21 to 28

Comparative Examples 11, 12

A stereolithographic molding was carried out as follows:

Example 21

According to the resin formulation (numerical value means "parts by weight") as shown in Table 3, a stereolithographic resin composition was obtained by thoroughly mixing the following: (1) 50 parts by weight of the aforementioned Epoxy resin A and 50 parts by weight of the aforementioned Epoxy resin B as a cationically polymerizing organic substance, and (2) 3 parts by weight of the aforementioned Initiator 4 as an energy beam sensitive cationic polymerization initiator. The obtained resin composition was a transparent light-yellow liquid.

Then, a hollow and cylindrical test specimen, 9 cm in height, 5 cm in diameter, was obtained from the above resin composition by curing it in steps of 0.1 mm thickness according to CAD data, using a stereolithographic experiment system consisted of a three-dimensional numerically controlled table on which a container for the resin composition was to be placed, an ultraviolet argon laser (wavelength: 333, 351 and 364 nm multiline, output: 100 mV), and a control unit comprising an optical system and a control computer. It took 70 minutes to obtain this specimen. The precision of the molding was 0.06% in height, and 0.03% in diameter relative to the design dimensions. Also, a hollow specimen "3 mm×10 mm×50 mm" was prepared in order to test the change resulted from absorption of water. This specimen was dried holding in a decicator for five days. The specimen was held for 5 days in a thermo-hygrostat in which the temperature was 30° C. and the humidity was 90% RH, and then the coefficient of expansion "%" occured by humidity was determined from 50 mm of the length of the side. As the result, the coefficient of expansion was 0.01%.

EXAMPLES 22 to 28

Comparative Examples 11, 12

According to the resin formulation (numerical value means "parts by weight") as shown in Table 3, the each resin composition was prepared and tested in the same manner as in Example 21. The test results are shown in Table 3, together with the result of Example 21. Thus, the compounds used in these tests, except for the aforementioned compounds are shown as follows:

For the radically polymerizing organic compounds (hereafter "radical resin"), radical resins 1 through 3 as shown below were used:
Radical resin 1: bisphenol A diglycidyl ether diacrylate.
Radical resin 2: trimethylolpropane triacrylate.
Radical resin 3: dipentaerythritol hexaacrylate.

For energy beam sensitive radical polymerization initiators (hereafter "radical initiators"), radical initiators 1 and 2 as shown below were used:
Radical initiator 1: 1-hydroxy-cyclohexyl-phenyl ketone.
Radical initiator 2: 2,2-dimethoxy-1,2-diphenylmethane-1-one.

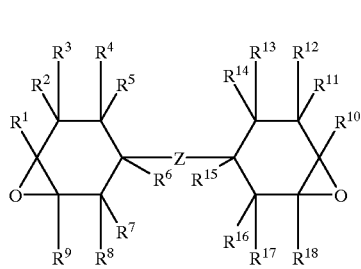

(I)

wherein 'Z' is a radical, having a valence of 2, and is —$C(CH_3)_2$—, and $R^1$~$R^{18}$, which may be identical or non-identical to each other, are hydrogen, halogen,

TABLE 3

| | Example | | | | | | | | Comparative example | |
|---|---|---|---|---|---|---|---|---|---|---|
| | 21 | 22 | 23 | 24 | 25 | 26 | 27 | 28 | 11 | 12 |
| Epoxy resin A | 50 | 20 | 50 | | 40 | 70 | 40 | | | |
| Epoxy resin B | 50 | 80 | | 70 | 20 | | | 60 | | |
| Epoxy resin C | | | 40 | 20 | | | 20 | 10 | 70 | 60 |
| Epoxy resin D | | | | 10 | | | | | 30 | 20 |
| Epoxy resin E | | | | | 10 | | | | | |
| Initiator 3 | | | 2 | | | | | | | 2 |
| Initiator 4 | 3 | | | 2 | 2 | | | | | |
| Initiator 5 | | 5 | | | | 3 | 3 | 3 | 3 | |
| Radical resin 1 | | | | | 20 | | 20 | 30 | | 20 |
| Radical resin 2 | | | | | 20 | 20 | | | | |
| Radical resin 3 | | | | | | 10 | 10 | | | |
| Radical Initiator 1 | | | | | 2 | | 3 | 2 | | 2 |
| Radical Initiator 2 | | | | | | 2 | | | | |
| Molding time (min) | 70 | 70 | 60 | 60 | 50 | 50 | 55 | 55 | 100 | 70 |
| Precision (height, %) | 0.06 | 0.05 | 0.06 | 0.06 | 0.09 | 0.1 | 0.08 | 0.06 | 0.06 | 0.1 |
| Precision (rad, %)[6] | 0.03 | 0.03 | 0.04 | 0.03 | 0.02 | 0.05 | 0.04 | 0.02 | 0.02 | 0.03 |
| Expansion by water (%)[7] | 0.01 | 0.02 | 0.01 | 0.02 | 0.01 | 0.02 | 0.04 | 0.03 | 0.6 | 0.45 |

Note
[6]Precision of radial direction
[7]Expansion by water absorption

Industrial Feasibility

As described above, according to the present invention, an energy beam curable resin composition, the cured articles having such superior physical properties as improved chemical resistance, water-resistance, humidity resistance, adhesion property and reduced shrinkage on curing, as well as superior dimensional stability on humidity-absorption, can be obtained. And therefore, a stereolithographic resin composition and a stereolithographic method using the said resin composition can be also obtained.

We claim:
1. An energy beam curing epoxy resin composition for coating and molding materials having improved humidity resistance comprising, as essential components thereof:

(1) cationically polymerizing organic substance having the general formula, as follows, hydrocarbon group, which may contain oxygen or halogen, or alkoxy group, which may be substituted; and (2) an energy beam sensitive cationic polymerization initiator.

2. The energy beam curable epoxy resin composition according to claim 1, which further comprises,
(3) a cationically polymerizing organic substance except for that of the aforementioned general formula (I).

3. The energy beam curable epoxy resin composition according to claim 2, which further comprises,
(4) a radical polymerizable organic compound; and
(5) an energy beam sensitive radical polymerization initiator.

4. The energy beam curable epoxy resin composition according to claim 1, which further comprises,
(4) a radically polymerizing organic compounds; and
(5) an energy beam sensitive radical polymerization initiator.

5. The energy beam curable epoxy resin composition according to claim 4, wherein 50 wt % or more of the (4) radically polymerizing organic compound is a compound having (meth)acrylic group per one molecule.

* * * * *